(12) United States Patent
Li

(10) Patent No.: US 6,458,640 B1
(45) Date of Patent: Oct. 1, 2002

(54) GAAS MESFET HAVING LDD AND NON-UNIFORM P-WELL DOPING PROFILES

(75) Inventor: Weiqi Li, Easton, PA (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 09/871,740

(22) Filed: Jun. 4, 2001

(51) Int. Cl.[7] ............ H01L 21/338; H01L 21/337; H01L 21/28
(52) U.S. Cl. ............ 438/167; 438/181; 438/195; 438/572
(58) Field of Search .............. 438/167, 169, 438/576, 174, 572, 181, 185, 195

(56) References Cited

U.S. PATENT DOCUMENTS

| | | | | |
|---|---|---|---|---|
| 4,452,646 A | * | 6/1984 | Zuleeg | 148/1.5 |
| 4,717,685 A | * | 1/1988 | Nakajima | 437/44 |
| 4,855,246 A | | 8/1989 | Codella et al. | 437/41 |
| 4,963,501 A | | 10/1990 | Ryan et al. | 437/40 |
| 5,001,077 A | | 3/1991 | Sakai | 437/41 |
| 5,014,018 A | | 5/1991 | Rodwell et al. | 333/20 |
| 5,254,492 A | * | 10/1993 | Tserng et al. | 437/56 |
| 5,256,996 A | | 10/1993 | Marsland et al. | 333/20 |
| 5,300,795 A | * | 4/1994 | Saunier et al. | 257/192 |
| 5,314,833 A | * | 5/1994 | Lee et al. | 437/41 |
| 5,349,225 A | | 9/1994 | Redwine et al. | 257/336 |
| 5,406,096 A | | 4/1995 | Malhi | 257/114 |
| 5,496,779 A | * | 3/1996 | Lee et al. | 437/40 |
| 5,536,666 A | * | 7/1996 | Miller et al. | 437/41 |
| 5,578,512 A | | 11/1996 | Tao | 437/39 |
| 5,580,803 A | * | 12/1996 | Oh et al. | 437/40 |
| 5,804,849 A | | 9/1998 | Wennekers | 257/280 |
| 5,869,364 A | * | 2/1999 | Nakano et al. | 438/167 |
| 5,942,773 A | | 8/1999 | Kaneko | 257/280 |
| 6,090,649 A | * | 7/2000 | Suemitsu et al. | 438/172 |
| 6,127,272 A | * | 10/2000 | Weitzel et al. | 438/694 |
| 6,134,424 A | | 10/2000 | Nishihori et al. | 455/127 |
| 6,316,197 B1 | * | 11/2001 | Matsuda | 438/174 |
| 6,329,677 B1 | * | 12/2001 | Oguri et al. | 257/194 |

FOREIGN PATENT DOCUMENTS

| | | | |
|---|---|---|---|
| JP | 404359467 A | * | 12/1992 |
| JP | 404359468 A | * | 12/1992 |
| JP | 405190483 A | * | 7/1993 |
| JP | 406236897 A | * | 8/1994 |

\* cited by examiner

*Primary Examiner*—Matthew Smith
*Assistant Examiner*—Chung Auh Luu
(74) *Attorney, Agent, or Firm*—Pennie & Edmonds LLP

(57) ABSTRACT

A MESFET has a conduction channel provided with a first doping profile in a first portion which extends between the source and the gate, and a second doping profile in a second portion which extends between the gate and the drain. A background p-type region is provided beneath the first portion, but not necessarily behind the second portion.

5 Claims, 3 Drawing Sheets

US 6,458,640 B1

GAAS MESFET HAVING LDD AND NON-UNIFORM P-WELL DOPING PROFILES

RELATED APPLICATIONS

NONE

TECHNICAL FIELD

The present invention is directed to the general field of forming gallium arsenide (GaAs) semiconductor devices. More particularly, it is directed to forming GaAs Metal-Semiconductor Field Effect Transistors (MESFETs).

BACKGROUND OF THE INVENTION

FIG. 1 illustrates a simplified structure of a conventional GaAs MESFET 100. The MESFET 100 has a GaAs substrate 102, a source region 104, a drain region 106, an n-type channel 108, and a p-type background region 110 and. A source electrode 112 is formed above the source region 104, a drain electrode 114 is formed above the drain region 106 and a gate electrode 116 is formed between the source and drain electrodes on a surface of the GaAs substrate, and above the n-type channel 108. As seen in FIG. 1, the gate electrode 116 is formed in a depressed area 118 formed in the upper surface of the device. When a voltage is applied to the gate electrode 116, the width of the n-type channel changes, thereby affecting the flow of current between the source electrode 112 and the drain electrode 114.

In conventional ion implanted, or epitaxially grown, GaAs MESFET devices, such as that depicted in FIG. 1, the channel 108 is doped uniformly between the source 104 and drain 106 regions. The result is that the p-type background forms a p-n junction with the n-type channel doping underneath the channel. When the MESFET 100 is used as an amplifier, it normally operates with high electrical field intensity in the gate-drain region. In high RF power amplifiers, the electrical field in the gate-drain region may be high enough to initiate impact ionization, in which both excessive electrons and holes are generated. In such case, the holes become trapped in the p-n junction, thereby forming a virtual back-gating, which results in a pinch-off the n-channel 108. This phenomenon is termed a power transient in RF amplifiers, which is detrimental to normal operation.

SUMMARY OF THE INVENTION

The present invention uses selective ion implantation techniques to create a GaAs MESFET device with non-uniform doping profiles in the conduction channel. In the Source-Gate region of the MESFET, a conventional p-type implantation is used as the background, and one or more n-type implantations form the conduction channel. In the Gate-Drain region of the device, there is either no, or a reduced, background p-type implantation, and the n-type implantation dose is also reduced, resulting in lower doping concentration between the gate and the drain.

The present invention is also directed to a method for forming a GaAs MESFET having non-uniform doping profiles in the conduction channel. This is accomplished by forming a lightly-doped first conduction channel of a first type, forming a moderately doped second conduction channel of the first type along a first portion of the first conduction channel, forming a background region of a second type beneath the second conduction channel, forming source and drain regions at opposite ends of the first conduction channel, forming source and drain contacts over corresponding source and drain regions, and forming a gate contact between the source and drain contacts, the gate contact being positioned approximately over an end of the second conduction channel.

BRIEF DESCRIPTION OF THE DRAWINGS

The present invention is next described with reference to the following figures, in which.

DETAILED DESCRIPTION OF THE INVENTION

The process for forming a GaAs MESFET having a non-uniformly doped channel is now described.

Figure 1:
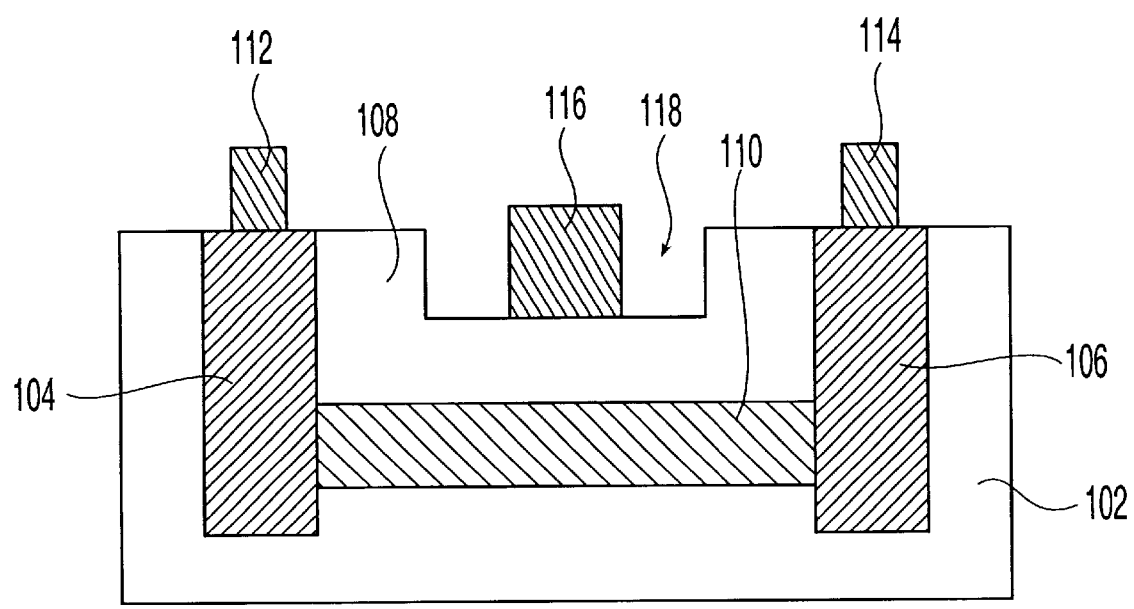
FIG. 1 shows a prior art GaAs MESFET with uniform channel doping.
Figure 2A:
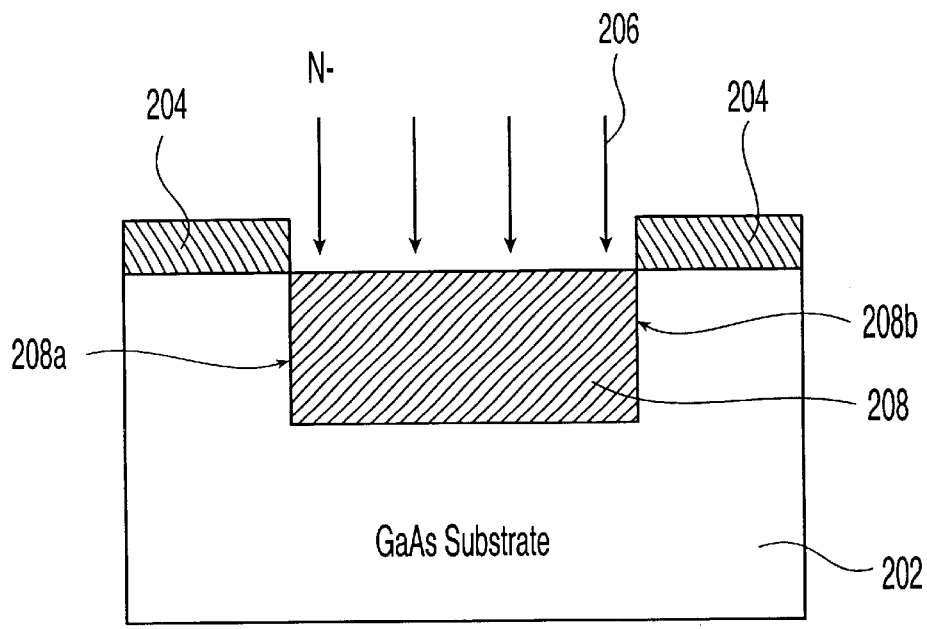
FIGS. 2a–2d show various stages in forming a GaAs MESFET in accordance with the present invention.

As seen in FIG. 2a, a substrate 202 is first provided. The substrate is preferably formed from GaAs, although it may instead be formed of such materials as $Al_xGa_{(1-x)}As$, $In_xGa_{(1-x)}As$, x~[0.0–1.0], and InP.

A first photoresist layer 204 is placed over selected regions of the upper surface 206 of the substrate. The photoresist 204 is deposited using a mask (not shown) and is configured to expose a first, preferably continuous upper surface area of the substrate above what will eventually become the channel.

Next a lightly doped n-channel 208 having a first length defined between first end 208a and second end 208b is formed in the substrate. To do this, n-type ions 206 are implanted into the substrate, as depicted by the arrows. The n-type ions, preferably in form of silicon ions, are implanted at an energy of between approximately 25 KeV and 200 Kev, and so penetrate the substrate to a depth of between approximately 0.5 nm and 1.2 µm. The n-type ions preferably are implanted at a relatively low dosage of between approximately $1E12/cm^2$ and $5E12/cm^2$, thereby forming the lightly doped n-channel 208.

Figure 2B:
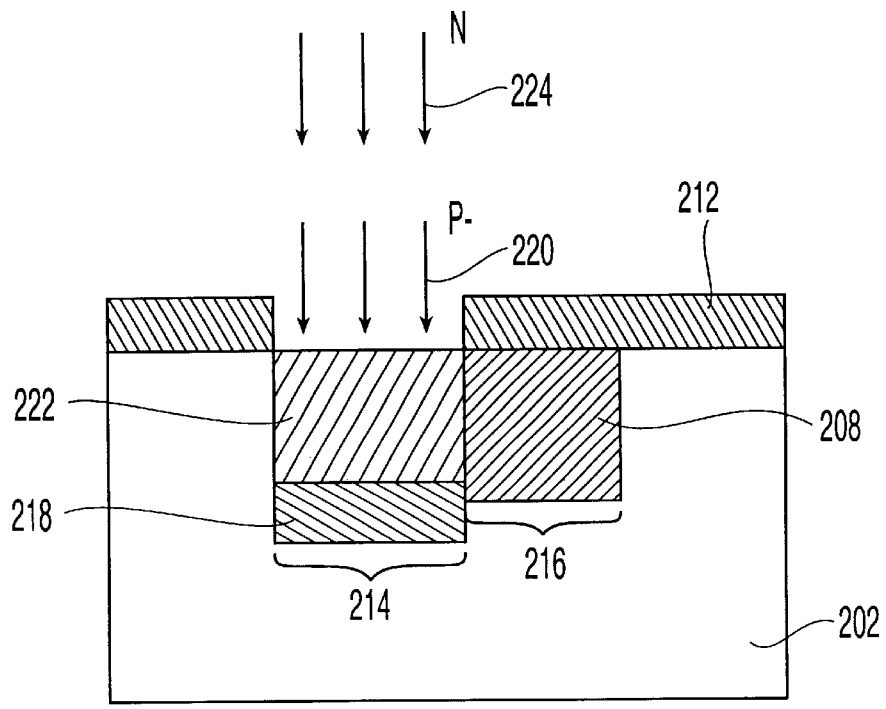

As seen in FIG. 2b, a second photoresist layer 212 is then placed over the resulting structure. The second photoresist layer 212 is configured to expose a first portion 214 of the lightly doped channel 208 while a second portion 216 of the lightly doped channel 208 is covered. Next, a p-type background region 218 having a second length shorter than the first length and extending from proximate to the first end 208a of the lightly-doped n-channel 208 is formed in first portion 214. The p-type background region 218 is formed at or near the boundary between the first portion 214 of the lightly doped n-channel 208 and the substrate 202 below. To do this, p-type ions 220 are implanted into the substrate, as depicted by the arrows. The p-type ions, preferably in the form of beryllium or magnesium ions, are implanted at an energy of between approximately 30 KeV and 200 KeV, and so penetrate to a depth of between approximately 0.1 nm and 1.5 µm. The p-type ions preferably are implanted at a dosage of between approximately $1E11/cm^2$ and $1E12/cm^2$, thereby forming the p-type background region 218, a "p-well", in only the first region 214 of the n-channel 208. As seen in the figures, the p-type background region 218 extends along the first portion 214 in a direction parallel to the upper surface, at one end of the n-channel 208.

Next, using the same photoresist mask, a moderately doped n-type channel region 222 is formed in the first region 214 of the lightly doped n-channel 208, above the p-type background region 218. The moderately doped n-type channel region 222 has a third length which is substantially similar to the second length and extends from proximate to the first end 208a of the lightly-doped n-channel 208. To form the channel region 222, n-type ions 224 are implanted into the first portion 214 of the lightly doped n-channel 208, as depicted by the arrows. The n-type ions, preferably in the form of silicon ions, are implanted at the substantially same energy as that used to create the lightly doped n-channel 208 and so penetrate to about the same depth, just above the p-type background region 218. The n-type ions preferably are implanted at a dosage of between approximately $1E12/cm^2$ and $5E12/cm^2$, thereby converting the original lightly doped n-channel 208 into a moderately doped n-channel region 222 in only the first region 214 of the n-channel 208. It should be noted here that one can reverse the order in which the p-type background region 218 and the moderately doped n-type channel regions 222 are formed, without substantially impacting the performance of the ultimate device. While FIG. 2b shows the regions 218 and 222 to be distinct and non-overlapping, it should be kept in mind that due to distribution of ion energies, the regions do not always have a crisp boundary, but rather somewhat merge together.

Figure 2C:
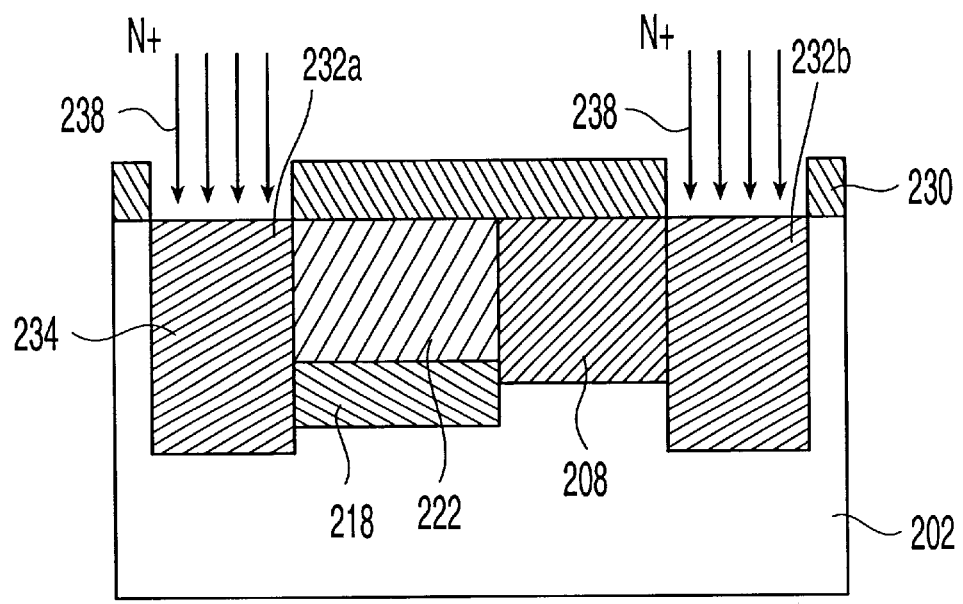

As seen in FIG. 2c, a third photoresist layer 230 is then placed over the resulting structure. The third photoresist layer substantially covers the first 214 and second 216 regions of the original lightly doped n-channel 208, and leaves exposed a pair of lateral areas 232a, 232b of the substrate on either side of the original n-channel 208. The lateral areas are situated over what will eventually become the source region 234 and the drain region 236. To convert the substrate below lateral areas 232a, 232b into the source 234 and drain 236 regions, n-type ions 238 are implanted into the regions of the substrate below the lateral areas 232a, 232b, as depicted by the arrows. This results in the formation of a source region 234 adjacent to one end of the moderately doped n-channel 222 and the p-type background region, and also results in the formation of a drain region 236 adjacent to an end of the lightly doped n-channel 208. The n-type ions, preferably in the form of silicon ions, are implanted at an energy of between approximately 50 KeV and 100 KeV, and so penetrate to a depth of between approximately 0.5 $\mu$m and 1.0 $\mu$m. Furthermore, the n-type ions preferably are implanted at a dosage of between approximately $5E12/cm^2$ and $1E13/cm^2$, thereby converting the substrate into highly doped n-type regions 234, 236. It should be noted here that while the source 234 and drain 236 regions preferably are formed in a single step, it may also be possible to form them in separate step, especially in the event that the two regions are to be differently doped, or have different depths.

Figure 2D:
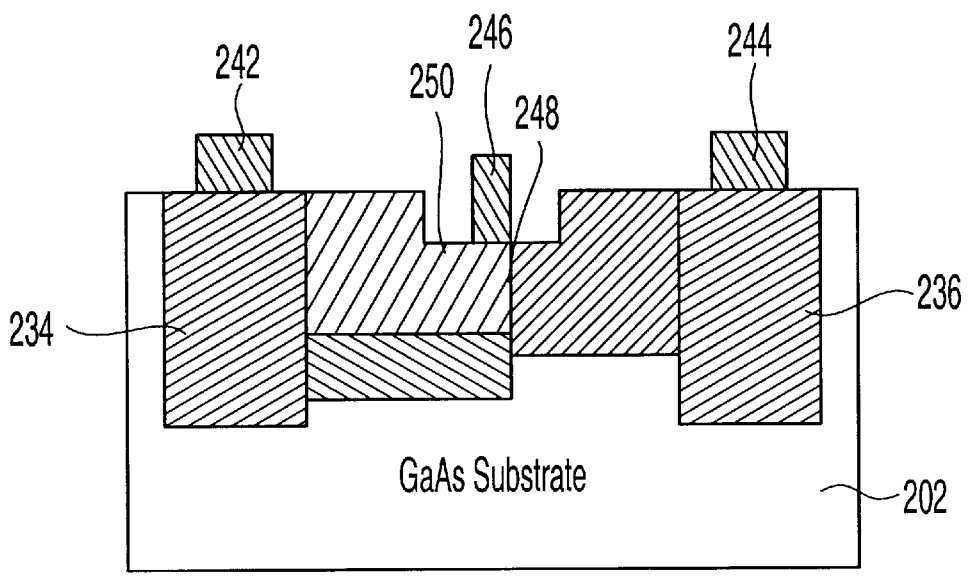

As seen in FIG. 2d, source 242 and drain contacts 244, preferably made of germanium gold (GeAu), are formed over respective source 234 and 236 drain regions. In addition, a gate contact 246 is formed between the source and drain contacts. As is known to those skilled in the art, the gate contacts are typically formed from Ti/Pt/Au, or other refractory metal, such as Mo, W, TiW, and the like. Preferably, the gate contact 246 is positioned near the second end of the moderately doped n-channel 222 extending between the source and the gate; the gate contact may even straddle the boundary 248 between the channel 222 and the lightly doped n-channel 208 extending between the gate and the drain, or be positioned entirely above the lightly-doped n-channel adjacent to the boundary 248. Also, as seen in FIG. 2d, the gate is formed in a depression 250 created in the upper surface of the device, the depression having the effect of physically limiting the width of the channel below. While the source 242 and drain 244 contacts are preferably formed at the same time a single photoresist mask, they may be made in separate steps. Furthermore, the gate contact 248 preferably is formed after the source and drain contacts are formed.

The final device has a conduct channel between the source and the drain which has a first doping profile between the source and the gate, and a second doping profile between the drain and the gate. More particularly, the MESFET of the present invention has p-type background region between the source and the gate, forming a p-well profile. The n-type channel implant dosage is reduced in the gate-drain region to form a lightly doped drain (LDD), as compared to the n-type channel implant dosage in the source-gate region.

The design of the present invention helps mitigate the p-n junction in the gate-drain region, while the LDD profile helps minimize the peak electric field intensity in the drain region. The LDD profile may also assist in increasing the gate-drain breakdown voltage, and alleviate the initiation of impact ionization, thereby mitigating the power transients caused by excessive hole trapping in the drain region.

In general, the P-well LDD GaAs MESFET design of the present invention does not severely degrade the device DC and RF performance, as compared to conventionally implanted GaAs MESFETs. This is because the channel current and the transconductance of a GaAs MESFET are mainly determined by the doping profiles in the source-gate region, where it is the same for both the P-well LDD GaAs MESFET of the present invention and the conventional MESFET. Furthermore, in normal amplifier operation, the electrons travel at saturation velocity in the gate-drain region and so the LDD doping profile generally does not negatively affect the channel electron transport process.

Also, although the final MESFET is an n-channel semiconductor device, this is not intended as a limitation of the present invention and as those skilled in the art will appreciate, a P-channel semiconductor device may be achieved by converting P-type regions to N-type regions, and vice versa.

Finally, while the above invention has been described with reference to certain preferred embodiments, it should be kept in mind that the scope of the present invention is not limited to these. One skilled in the art may find variations of these preferred embodiments which, nevertheless, fall within the spirit of the present invention, whose scope is defined by the claims set forth below.

What is claimed is:

1. A method of manufacturing a metal-semiconductor field effect transistor (MESFET) comprising the steps of:

providing a substrate having an upper surface;

implanting a low dosage n-type dopant into a first volume of the substrate to thereby form a lightly doped n-channel having a first length extending in a direction parallel to the upper surface, the lightly doped n-channel having a first channel end and a second channel end;

implanting a p-type dopant into a second volume of the substrate to thereby form a p-type background region having a second length shorter than the first length, the second volume having a first end and a second end, and extending from the first channel end towards the second channel end;

implanting a moderate dosage n-type dopant into a third volume of the substrate to thereby form a moderately doped n-channel having a third length shorter than the first length, the third volume having a first end and a second end, and extending from the first channel end towards the second channel end;

implanting a high dosage n-type dopant into spaced apart fourth and fifth volumes formed on either side of said first volume, with the fourth volume in communication with the first end of the second and third volumes, and the fifth volume in communication with the second channel end;

forming a source electrode above the fourth volume, a drain electrode above the fifth volume, and a gate electrode between the source and drain electrodes, the gate electrode being formed approximately above the second end of the third volume, wherein the third volume is positioned substantially between the upper surface and the second volume;

the second and thirds lengths are substantially similar with the first ends of the second and third volumes substantially coinciding with the first channel end.

2. The method according to claim 1, wherein the p-type dopant is implanted before the moderate dosage n-type dopant is implanted.

3. The method according to claim 1, wherein the p-type dopant is implanted after the moderate dosage n-type dopant is implanted.

4. The method according to claim 1, wherein the second and third volumes overlap.

5. The method according to claim 1, wherein the step of providing a substrate, comprises providing a gallium arsenide substrate.

* * * * *